United States Patent

Statovici et al.

[11] Patent Number: 6,167,545
[45] Date of Patent: Dec. 26, 2000

[54] SELF-ADAPTIVE TEST PROGRAM

[75] Inventors: Mihai G. Statovici, San Jose; Ronald J. Mack, Gilroy, both of Calif.

[73] Assignee: Xilinx, Inc., San Jose, Calif.

[21] Appl. No.: 09/044,585

[22] Filed: Mar. 19, 1998

[51] Int. Cl.$^7$ ................................................. G01R 31/28
[52] U.S. Cl. .......................................... 714/724; 324/73.1
[58] Field of Search ............................. 714/51, 738, 724; 395/500.05; 324/73.1; 364/551

[56] References Cited

U.S. PATENT DOCUMENTS

| | | | |
|---|---|---|---|
| 4,642,784 | 2/1987 | White, Jr. et al. | 364/551 |
| 5,004,978 | 4/1991 | Morris, Jr. et al. | 714/738 |
| 5,206,582 | 4/1993 | Ekstedt et al. | 324/73.1 |
| 5,381,344 | 1/1995 | Rohrbaugh et al. | 395/500.05 |
| 5,495,578 | 2/1996 | Rohrbaugh et al. | 714/51 |

*Primary Examiner*—Albert De Cady
*Assistant Examiner*—David Ton
*Attorney, Agent, or Firm*—Adam H. Tachner, Esq.; Crosby, Heafey, Roach & May; Michael R. Casey, Esq.

[57] ABSTRACT

A method and software apparatus are provided for implementing a dynamically modifiable test flow for integrated circuit devices that adapts to the characteristics of each processed device lot. According to the method of the invention, a modified set of tests sufficient to ensure proper device function for a particular lot is performed, reducing test costs and increasing test capacity. The method and system of the invention periodically samples a predetermined sample number of devices using a full set of tests including a set of skippable tests. Depending upon the performance characteristics of the sample device group on the skippable tests, a number of skippable tests are skipped during a modified test flow. After a next set of devices is tested using the modified test flow, the full set of tests is again performed on another sample group, and the size and makeup of the modified test flow is adjusted according to the new results. A test summary logs the results of regular and skippable tests, providing user access to enable system modification according to desired acceptance quality levels.

18 Claims, 4 Drawing Sheets

SELF-ADAPTIVE TEST PROGRAM

BACKGROUND OF THE INVENTION

1. Field of the Invention

The present invention is related generally to semiconductor device testing and specifically to self-adaptive modification of testing procedures to optimize test completion speed without reducing test coverage.

2. Description of the Background Art

Semiconductor devices are typically fabricated in large lots on silicon wafers. The fabrication process includes various steps such as deposition, electron beam lithography, plasma etching, sputtering and other techniques well known to those skilled in the art of semiconductor fabrication. As with any manufacturing process, defects arise during semiconductor fabrication. These defects must be detected by the manufacturer before devices are delivered to customers.

There are generally three types of tests for detecting defects on semiconductor devices: DC parametric tests, AC parametric tests, and functional tests. DC parametric tests include measuring input currents, output signals, and power consumption of the semiconductor device. AC parametric tests include measuring propagation delay between input and output terminals, minimum clock pulse width, and maximum operating frequency of the semiconductor device. Functional tests include testing whether the semiconductor device functions as designed under prescribed operating conditions. Typically, a functional test is carried out by applying a test pattern to the input terminals and comparing the generated output signals with an expected pattern. Minimum or maximum power supply (Vdd) and input signals are normally used during functional tests to emulate the full range of operating conditions.

The purpose of testing integrated circuits is to guarantee with a desired degree of confidence that any device shipped to the customer will meet all of the data sheet specifications (functionality, speed, voltages, currents, reliability, etc.) over the specified set of operating conditions, and over the entire life of the device. As circuit complexity grows, full test coverage requires increasing testing costs due to the high number of tests and the time consumed to perform them. Devices including in-system programmable (ISP) circuitry, for which test signals must be input in serial fashion, have particularly high testing costs. An important engineering challenge is therefore to find a minimal set of tests that consistently passes only devices that meet predetermined quality assurance standards.

One possible approach is to drop tests that appear unnecessary, based upon a statistical test program query, due to a zero failure rate. Indeed, even a minimal set of tests performed on an entire lot of devices normally includes at least one test that is never failed. However, such tests are only consistently found in typical device lots; where process variations and flaws are present, no test result can be taken for granted. Consequently, tests cannot be dropped from a test flow without the unacceptable risk of shipping defective parts. Moreover, for different types of silicon material and integrated circuit devices, there are different subsets of "statistical never fail" tests, and it is therefore impractical to predetermine a set of such tests before testing of a given lot begins.

In the field of programmable logic devices such as Complex Programmable Logic Devices (CPLDs), to which a specific embodiment of the present invention pertains, tests are typically performed on every manufactured device to ensure proper performance of every device shipped to customers. However, as explained above, such thorough and straightforward testing requires significant time and expense. There is therefore a need in the art to provide a method and system for device testing that diminishes the time and expense presently required, without compromising quality assurance.

SUMMARY OF THE INVENTION

To address the shortcomings of the available art, the present invention provides a method and apparatus for designing and implementing a test program that adapts dynamically to the characteristics of a given plurality of devices, providing a modified set of tests sufficient to guarantee proper device function at a designated acceptance quality level (AQL), while reducing costs and increasing test capacity for a given amount of resources. The novel software apparatus provided by the present invention periodically samples a predetermined number of devices using a full set of tests including a subset of skippable tests, then determines which of the skippable tests are to be skipped, providing a modified test set for a predetermined number of additional devices. (The term "skippable test" is used herein to mean a test that may be skipped under certain circumstances.) If none of the tests are to be skipped, the modified test set is the same as the full test set. After a plurality of devices is tested with the modified test set, the full test flow is again performed on another sample number of devices, and the composition of the modified test flow may be re-adjusted according to the new results. A test summary, including the failed and skipped tests and the number of times each such event occurs, is logged in a test summary log, thereby enabling system modification during the process to guarantee an AQL. One embodiment provides a dynamically modifiable test program for the XC9500™ family of complex programmable logic devices (CPLDs) available from Xilinx, Inc., assignee of the present invention.

It is therefore an advantage of the present invention to provide a method and apparatus for testing a given lot of integrated circuit devices, the given lot including a plurality of sample devices and a remainder of devices, the method comprising the steps of: 1) providing a first plurality of device tests for testing the given lot of devices for proper function under predetermined operating conditions; 2) designating as skippable a subset of the first plurality of tests; 3) executing the first plurality of tests on the plurality of sample devices and recording a plurality of test results; 4) creating, in a manner depending upon the plurality of test results, a second plurality of device tests comprising a subset of the first plurality, the second plurality excluding a number (zero or more) of the skippable tests; and 5) executing the second plurality of tests on a number of remaining devices.

In another embodiment, the first plurality of tests is executed on another plurality of sample devices, and another plurality of test results is recorded. Based on these new test results, a new test flow is created by skipping another number of skippable tests, and the new test flow is performed on another set of devices. This series of steps can then be repeated until the entire lot has been tested.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE DRAWINGS

Figure 1:
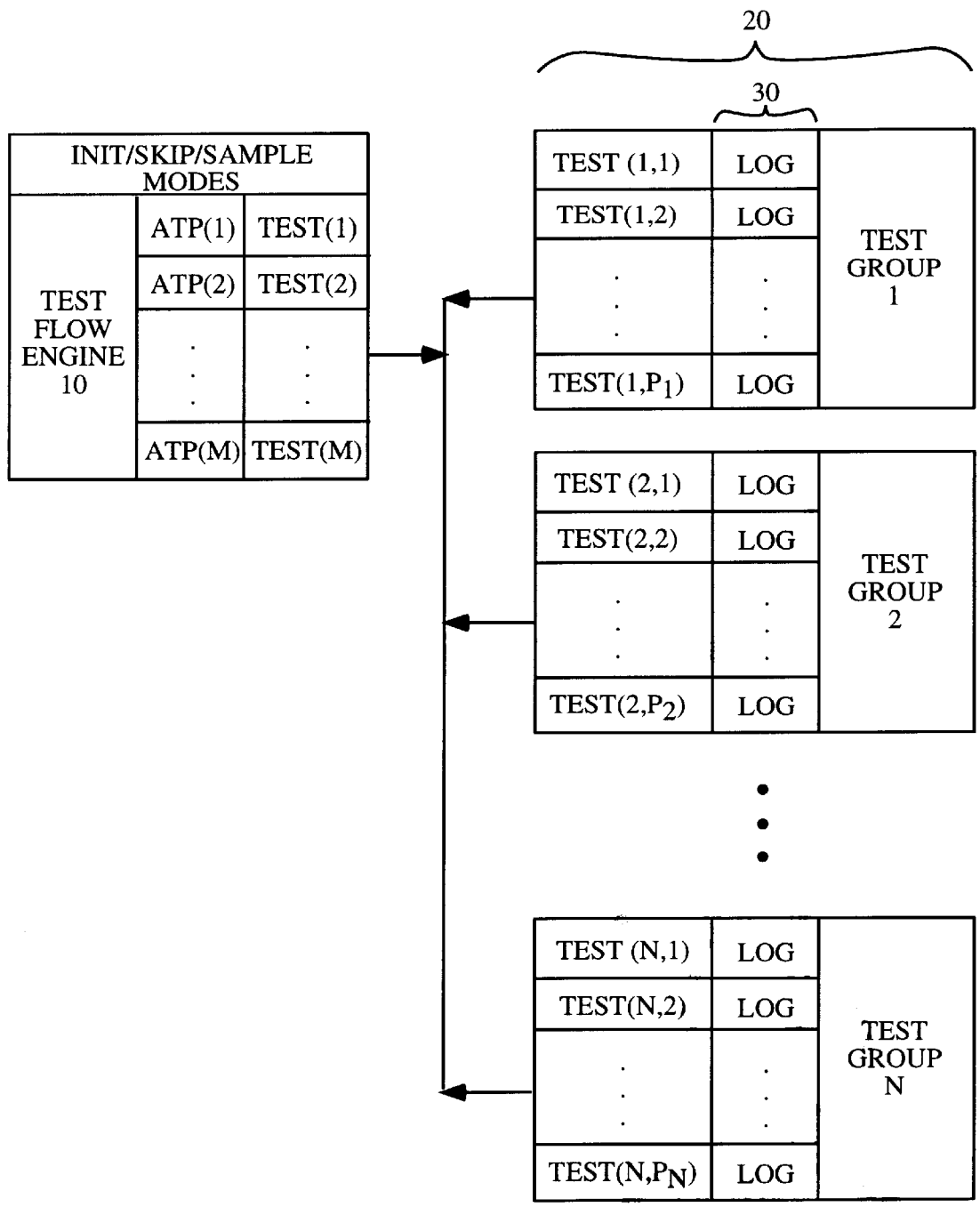
FIG. 1 illustrates the apparatus of the present invention as implemented in a computer software environment.

The method of the present invention begins with loading a test flow into a testing apparatus. A number of tests in the flow are designated skippable, denoting that they can be skipped under any of three conditions: 1) a statistically negligible chance exists that any device in the lot under test will fail the test; 2) a shorter version of the test will reveal the same flaw, thereby rendering the longer version of the test unnecessary; or 3) the same failure mode tested for by an earlier test will be detected by a later test or combination of tests in the flow, thereby rendering the earlier test unnecessary.

After loading the test flow into the testing apparatus, a full test flow is executed on a plurality of sample devices within a given lot, logging the failure of any skippable tests for future reference. For tests having both a long and a short version, first the short and then the long version is executed. An example of a valid short version of a test is the testing of in-system programmable (ISP) circuitry using a diagonal test pattern instead of a full pattern. A fail condition is logged when a skippable test is failed, such as when a device passes a short version of a test but fails a long version. After the full test flow is performed on a predetermined number of devices (the "sample number"), a log of the results is reviewed to determine which of the "skippable" tests were passed by a sufficient number of the sample number of devices. (The "sufficient number" may be statistically determined according to the guaranteed AQL required for the device lot under test.)

Next, for a "skip-size" number of devices, the skip-size being determined statistically according to the guaranteed AQL, a modified test flow is executed, excluding those skippable tests that were passed by a sufficient number of the sample devices. After the "skip-size" number of devices is tested using the modified test flow, the full flow is again executed for another sample number of devices (which may be the same as or different from the first sample number), and a new modified test flow is determined. This new modified test flow is then used to test another skip-size number of devices (which may be the same as or different from the first skip-size number).

In one embodiment, the same set of tests is skipped for the entire content of a given lot of devices.

Tests that indicate a test setup or execution-related problem are preferably detected and addressed early in the test process to ensure accurate testing and to avoid yield loss and test resource waste. For example, since short circuits to ground are not normally due to problems with the programmable logic devices themselves, discovered short circuits should be viewed as a probable indication of faulty test system setup or functionality. Therefore, in one embodiment a short circuit test is performed at the beginning of a test flow, so that test system problems are detected early and the tested devices are protected from over stress and damage. Of course, if such a test is not performed early in the process, the devices under test fail a number of subsequent tests (i.e., false-negative results) and the problem is caught later in the process.

One embodiment of the present invention is abstractly illustrated in FIG. 1, as implemented in computer software.

Test flow engine 10 implements a plurality of tests stored in an array 20. The tests in array 20 are divided into Test Groups 1 through N and labeled Test(1,1) through Test(N, $P_N$). ($P_j$ is the number of tests in Test Group j.) Test Groups 1 through N may include different numbers of tests; for example, $P_1$ is not necessarily the same as $P_2$. In this embodiment, each Test Group includes two types of tests, those which must be executed on every device, and those which are skippable. Array 20 also includes a LOG flag (column 30) for each test. After execution of each test, the outcome (pass or fail) is recorded in the LOG flag.

Test flow engine 10 includes a list of the skippable tests (Test(1) through Test(M)) included in array 20. Test flow engine 10 also includes an ATP flag (ATP(1) through ATP(M)) associated with each test. The status of the ATP flag determines whether test flow engine 10 includes the corresponding skippable test in the modified test sequence. Before executing a modified test sequence, test flow engine 10 determines whether or not to set the ATP flag for each skippable test by comparing the LOG flag to a predefined condition. For example, the ATP flag for a given test may be set (i.e., the test may be disabled) whenever the corresponding LOG flag shows that the skippable test was passed by every sample device.

Test flow engine 10 operates in initialization (INIT), SKIP, and SAMPLE modes. In INIT mode, test flow engine 10 performs the full test flow on a predetermined number of sample devices. Test flow engine 10 then determines and disables the tests to be skipped, based on the results from the previous INIT or SAMPLE mode. Next, in SKIP mode, test flow engine 10 performs the resulting modified test flow on a specified number of devices. All tests are then enabled, and in SAMPLE mode test flow engine 10 again performs the full test flow on a new set of sample devices.

Figure 2:
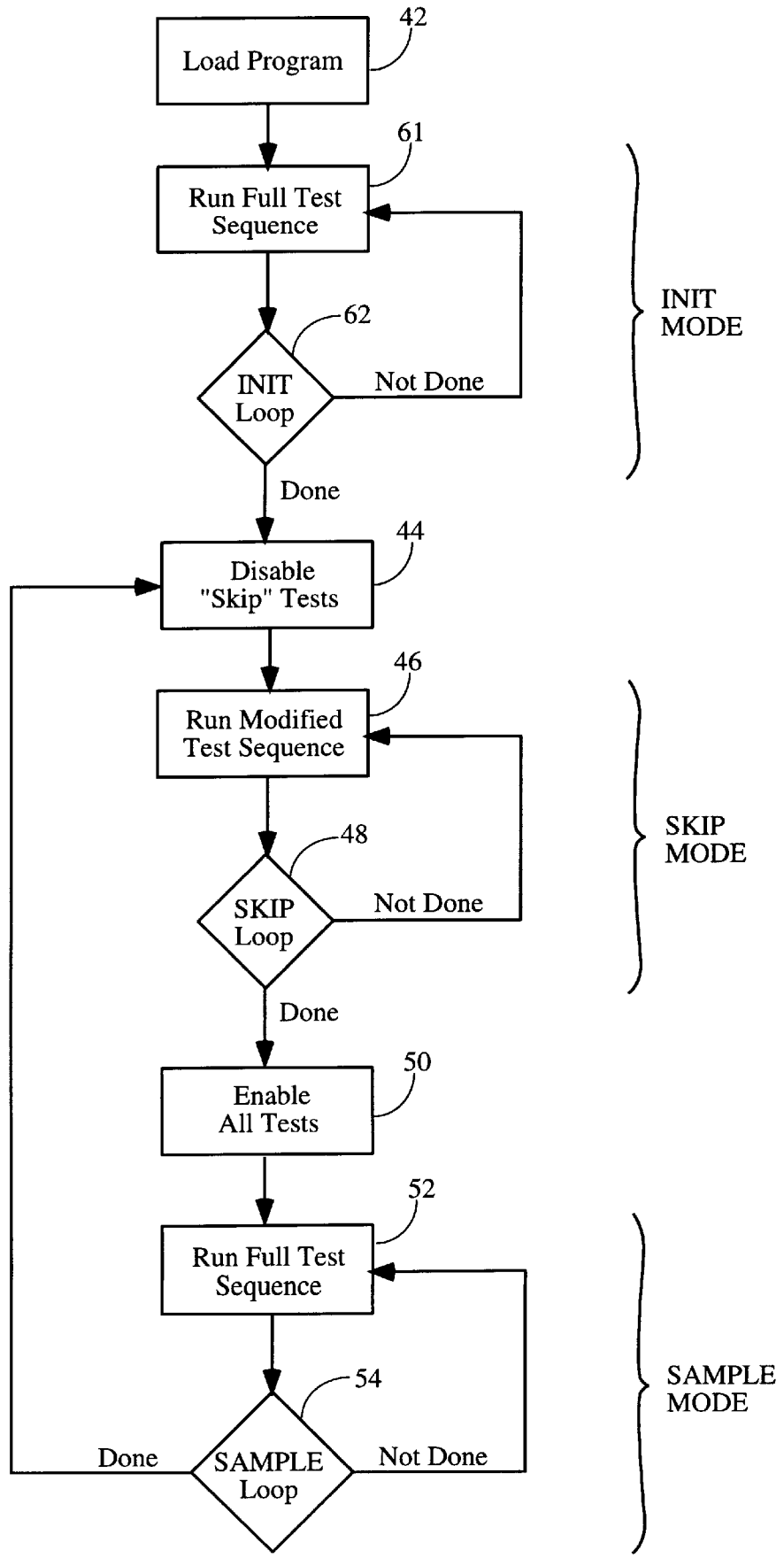
FIG. 2 provides a flowchart illustrating the method of the present invention.

FIG. 2 provides a flowchart illustrating the method of the present invention. After a full test flow is loaded at Program Loading step 42, test flow engine 10 is placed into INIT mode and executes the full flow of tests on a first sample device (step 61), logging the results in the corresponding LOG flags. Step 61 is repeated until a predetermined sample number of devices in a given lot have been fully tested (step 62).

Figure 2A:
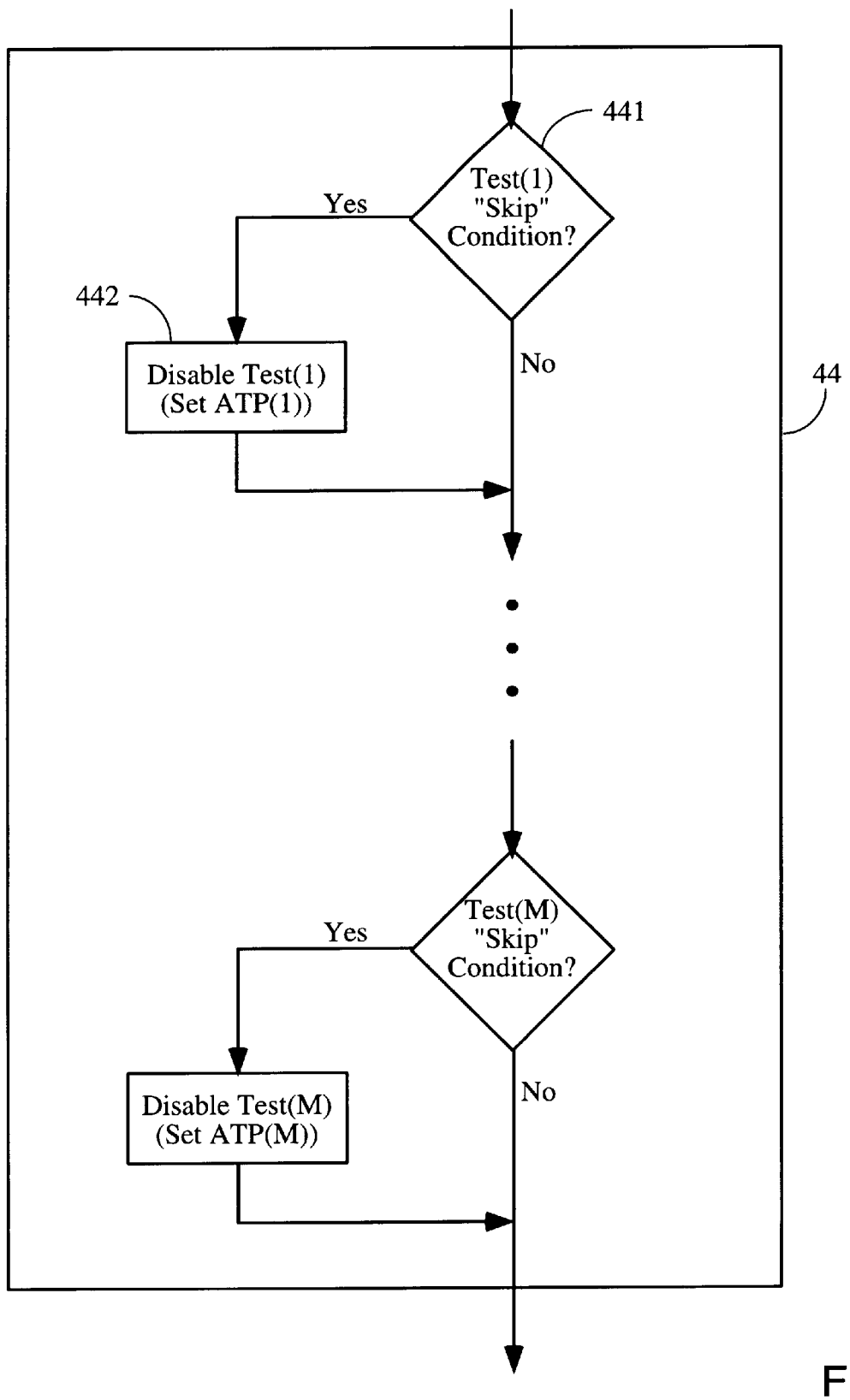
FIGS. 2A and 2B provide flowcharts illustrating details of the flowchart of FIG. 2.

In step 44, the modified set of tests is defined by disabling certain skippable tests. Referring to FIG. 2A, step 44 begins by testing for a skip condition in test Test(1) (step 441). A skip condition is found where a skippable test is passed by an acceptable number of devices in the sample group. The number of passing sample devices required for a skip condition is adjusted according to the desired AQL. Normally, a 100 percent pass rate is required for a skip condition to be found during the sample test flow. If a skip condition is found, test Test(1) is disabled by setting flag ATP(1) (step 442). The check for a skippable condition and the disabling function are then repeated for all tests through test Test(M).

Figure 2B:
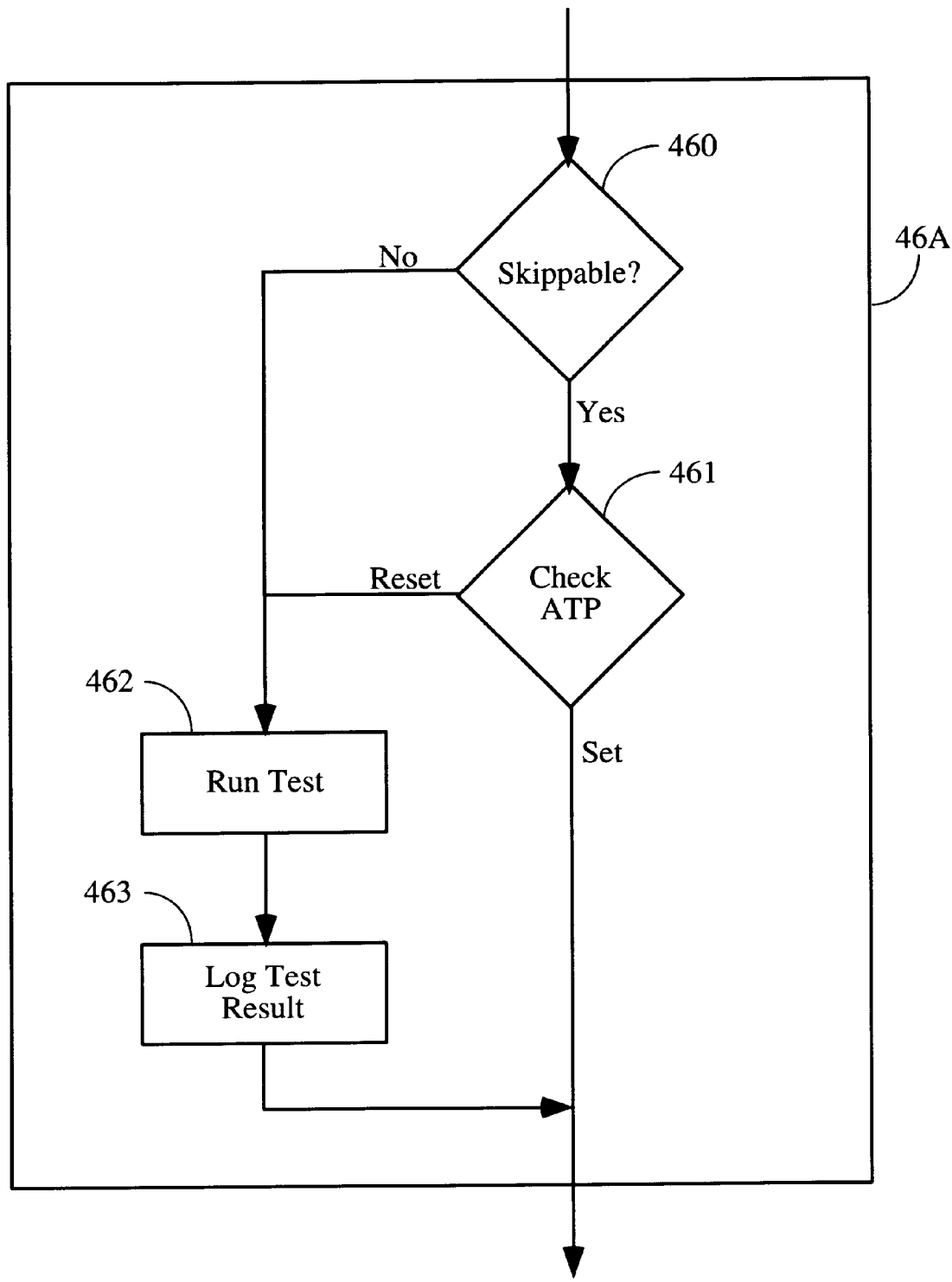

Returning to FIG. 2, in step 46 the test flow engine 10 (now in SKIP mode) executes the modified test flow on a first device. The modified test flow includes all non-skippable tests plus all enabled skippable tests. Step 46 comprises a repeated sequence of sub-step 46A, shown in FIG. 2B. Referring to FIG. 2B, step 46 begins by checking to see if the first test is skippable (step 460). If the first test is non-skippable, the test is performed (step 462) and the result is logged (step 463). If the first test is skippable, the ATP flag is checked to see if the test is enabled (step 461). If the ATP flag is set (i.e., if the test is disabled), the test flow engine continues to the next test. If the ATP flag is reset (i.e., if the test is enabled), the test flow engine runs the test on the device (step 462) and logs the test result (step 463), then continues to the next test. This sequence of steps (46A) is repeated until all non-skippable and all enabled skippable tests have been performed on the device.

Returning to FIG. 2, step 46 is repeated until a predetermined number of devices have been tested with the modified test sequence (step 48).

At step 50, the system is reset to enable all tests, both skippable and non-skippable. This step enables the capture of performance data from a new set of sample devices. Each of the previously skipped tests is re-enabled by resetting the corresponding ATP flag. The LOG files are also re-initialized.

At step 52, test flow engine 10 (now in SAMPLE mode) executes the full test flow on a first sample device. Step 52 is then repeated until a predetermined number of sample devices have been tested (step 54). The test results are logged and the flags set as in step 61. After testing a "sample-size" number of units, some skippable tests are disabled, modifying the test flow accordingly to generate a new modified sequence of tests, and the testing resumes until a designated number of devices have been tested.

Since functional tests are preferably executed at both minimum and maximum power supply levels while in INIT and SAMPLE modes, proper engineering analysis enables some of these tests to be skipped for either power level. Similarly, some tests (such as hold tests that check the time necessary for an input to be held after an active clock edge is received) allow a large margin of error (e.g., 5 to 10 nanoseconds), and failure is therefore very unlikely. Such tests are preferably performed in INIT or SAMPLE modes to check if an abnormal drift in parameters occurs, then, if no such drift is detected, the tests are skipped during the modified test flow.

The present invention therefore provides an accelerated method of testing a plurality of integrated circuit devices. Those having skill in the relevant arts of the invention will now perceive various modifications and additions which may be made as a result of the disclosure herein. For example, while the disclosure herein is primarily directed to the utilization of the invention for testing CPLDs, the invention can be advantageously used for any integrated circuit device. Accordingly, all such modifications and additions are deemed to be within the scope of the invention, which is to be limited only by the appended claims and their equivalents.

What is claimed is:

1. A method for testing a given lot of integrated circuit devices, the given lot including a plurality of initial sample devices and an initial set of devices, the method comprising the steps of:

providing a first plurality of tests for testing the given lot of integrated circuit devices for proper function under predetermined operating conditions;

designating as skippable a first subset of the first plurality of tests;

executing the first plurality of tests on the plurality of initial sample devices and recording a plurality of initial test results;

creating, in a manner depending upon the plurality of initial test results, a second plurality of tests comprising a second subset of the first plurality of tests, the second plurality excluding a number of the tests in the first subset designated as skippable; and executing only the second plurality of tests on the initial set of devices.

2. The method of claim 1, wherein the given lot also includes a plurality of additional sample devices and an additional set of devices, the method further comprising the steps of:

executing the first plurality of tests on the plurality of additional sample devices and recording a plurality of additional test results;

creating, in a manner depending upon the plurality of additional test results, a third plurality of tests comprising a third subset of the first plurality of tests, the third plurality excluding a number of the tests in the first subset designated as skippable; and executing the third plurality of tests on the additional set of devices.

3. The method of claim 1, wherein the first subset of tests includes a test for which a statistically negligible chance exists that any device in the given lot will fail.

4. The method of claim 1, wherein the first subset of tests includes a shorter test that will reveal the same flaw as revealed by a longer test.

5. The method of claim 1, wherein the first subset of tests includes an earlier test for which the same failure mode tested for by the earlier test will be detected by a later test in the first plurality of tests.

6. The method of claim 1, wherein the first subset of tests includes an earlier test for which the same failure mode tested for by the earlier test will be detected by a later combination of tests in the first plurality of tests.

7. The method of claim 1, wherein a ratio of a remainder of devices to the given lot of devices is a function of a desired acceptance quality level.

8. The method of claim 1, wherein the second subset of tests includes at least one test for flaws in a utilized testing apparatus rather than in the devices.

9. The method of claim 1, wherein the integrated circuit devices are Complex Programmable Logic Devices (CPLDs).

10. A software-based testing apparatus for testing a given lot of integrated circuit devices, the given lot including a plurality of initial sample devices and an initial set of devices, the apparatus being implemented in a computer system and comprising:

a first plurality of tests for testing the given lot of integrated circuit devices for proper function under predetermined operating conditions;

means for designating as skippable a first subset of the first plurality of tests;

means for executing the first plurality of tests on the plurality of initial sample devices and recording a plurality of initial test results;

means for creating, in a manner depending upon the plurality of initial test results, a second plurality of tests comprising a second subset of the first plurality of tests, the second plurality excluding a number of the tests in the first subset designated as shippable; and means for executing only the second plurality of tests on the initial set of devices.

11. The apparatus of claim 10, wherein the given lot also includes a plurality of additional sample devices and an additional set of devices, the method further comprising the steps of:

means for executing the first plurality of tests on the plurality of additional sample devices and recording a plurality of additional test results;

means for creating, in a manner depending upon the plurality of additional test results, a third plurality of tests comprising a third subset of the first plurality of tests, the third plurality excluding a number of the tests in the first subset designated as skippable; and means for executing the third plurality of tests on the additional set of devices.

12. The apparatus of claim 10, wherein the first subset of tests includes a test for which a statistically negligible chance exists that any device in the given lot will fail.

13. The apparatus of claim 10, wherein the first subset of tests includes a shorter test that will reveal the same flaw as revealed by a longer test.

14. The apparatus of claim 10, wherein the first subset of tests includes an earlier test for which the same failure mode tested for by the earlier test will be detected by a later test in the first plurality of tests.

15. The apparatus of claim 10, wherein the first subset of tests includes an earlier test for which the same failure mode tested for by the earlier test will be detected by a later combination of tests in the first plurality of tests.

16. The apparatus of claim 10, wherein a ratio of a remainder of devices to the given lot of devices is a function of a desired acceptance quality level.

17. The apparatus of claim 10, wherein the second subset of tests includes at least one test for flaws in a utilized testing apparatus rather than in the devices.

18. The apparatus of claim 10, wherein the integrated circuit devices are Complex Programmable Logic Devices (CPLDs).

* * * * *